United States Patent [11] 3,609,564

United States Patent

[11] 3,609,564

[72] Inventors Karoly Galyas Johanneschov; Benjamin Trok, Johanneshov; Erik Lennart Skogsberg, Huddinge, all of Sweden

[21] Appl. No. 862,843
[22] Filed Oct. 1, 1969
[45] Patented Sept. 28, 1971
[73] Assignee International Standard Electric Corporation New York, N.Y.
[32] Priority Oct. 4, 1968
[33] Sweden
[31] 13411/1968

[54] COMPARISON CIRCUIT FOR ALTERNATING VOLTAGES
5 Claims, 3 Drawing Figs.

[52] U.S. Cl. .......... 328/147, 307/235, 328/116, 330/30, 330/110
[51] Int. Cl. .......... H03k 5/20
[50] Field of Search .......... 307/235; 328/146, 147, 149, 115, 116; 330/110, 30 D, 69

[56] References Cited
UNITED STATES PATENTS
3,187,325 6/1965 Waldhauer .......... 330/110
3,305,733 2/1967 Jahn .......... 307/235

*Primary Examiner*—Donald D. Forrer
*Assistant Examiner*—David M. Carter
*Attorneys*—C. Cornell Remsen, Jr., Walter J. Vaum, Percy P. Lantzy, J. Warren Whitesel, Delbert P. Warner and James B. Raden

ABSTRACT: A circuit is provided for comparing alternating voltages without first rectifying them. In this circuit a capacitor and an amplifier circuit having high amplification are connected in series between each input and output terminal of the circuit, with a feedback circuit consisting of a diode device and a resistor being connected in parallel to each amplifier circuit and with the junction points of the diode devices and the resistors of the two feedback circuits being interconnected. In this manner a common threshold voltage will be achieved at the inputs of the amplifier circuits and thus, an output voltage only on the output terminal whose corresponding input terminal has been supplied with a higher input voltage.

Inventors
K. GALYAS-B. TROK-E. L. SKOGSBURG
2-1-3
By D.P. Warner
Attorney

COMPARISON CIRCUIT FOR ALTERNATING VOLTAGES

This invention refers to a comparison circuit having two input terminals and two output terminals and being adapted for directly comparing two alternating voltages with respect to their magnitudes.

In known comparison circuits for comparing alternating voltages, the alternating voltages have been rectified as a first step, whereafter a direct voltage comparison has been carried out. For said rectifying it has been necessary to make use of rectifier circuits having threshold values that decrease the dynamic region of the compared signals and that have made the reaction periods of the comparison circuit relatively long.

By means of the comparison circuit in accordance with this invention the comparison process is simplified to a considerable extent, wherein a threshold voltage that is comparable to the largest of the two voltages intended to be compared is built up and wherein only the alternating voltage that is larger than the voltage threshold value will appear at the corresponding output terminal of the comparison circuit. Thus a direct comparison between two alternating voltages is carried out. The circuit built up in accordance with the invention is characterized by a capacitor and an amplifier circuit having high amplification being connected in series between each input terminal and the corresponding output terminal, with a feedback circuit consisting of a diode device and a resistor being connected in parallel to each amplifier circuit and with the junction points of the diode devices and the resistors of the two feedback circuits being interconnected, thereby achieving an output voltage on the output terminal whose corresponding input terminal has been supplied with the highest input voltage.

The invention will now be more specifically described in the form of preferred embodiments with reference to the accompanying drawing.

Figure 1:
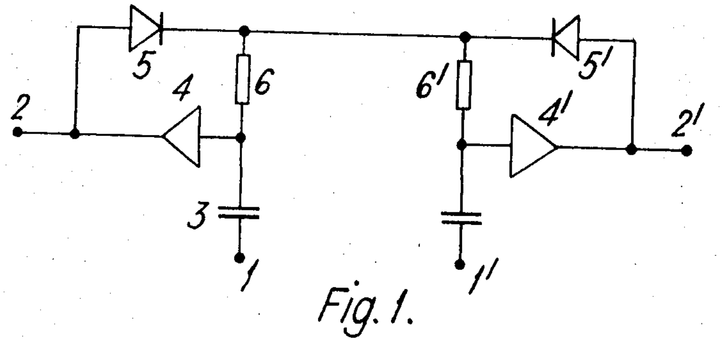
FIG. 1 shows an embodiment of a feedback circuit in accordance with the invention.

FIG. 1 illustrates the general principle of the comparison circuit in accordance with the invention. The designations 1 and 1′ refer to the input terminals of the circuit. The corresponding output terminals are designated 2 and 2′. Right from the start it may be pointed out that symmetry exists with respect to the components connected between the input terminals 1, 1′ and the corresponding output terminals 2, 2′. Between each set of input and output terminals 1, 2 and 1′, 2′, respectively, there are connected a capacitor 3, 3′ and an amplifier 4, 4′, which may consist of one or more amplifier stages comprising transistors. These components are connected in series, and the amplification of the amplifiers should be high, which will be explained further along in this description. Each of the mentioned feedback circuits over the amplifiers 4, 4′ consists of a diode device 5, 5′ and a resistor 6, 6′ in the drawing. The junction points between the diode devices 5, 5′ and resistors 6, 6′ of the two respective feedback circuits are interconnected.

The input voltages $U_1$in and $U_2$in to be compared are supplied to the respective inputs 1, 1′ of the comparison circuit (the zero voltage point is not designated in the drawing), and the capacitors 3, 3′ are provided for the purpose of blocking direct current components. The amplifiers 4, 4′ phase invert the incoming signals so as to prepare them for feedback. The amplification must be comparatively high, as a large output voltage is necessary for the rectification in the diode devices. The lower the input signal is, the higher will the amplification have to be. After passing the amplifiers 4, 4′, the voltage signals will have the form of spikes, which comprise the upper portion of the peaks of a sinus voltage. The voltage signals now pass through the diode devices 5, 5′ and the important direct threshold voltage is built up. As follows from the specific design of the circuit a threshold value common to both of said circuits will be provided at the junction point of the feedback circuits, with said threshold voltage substantially corresponding to the magnitude of the highest voltage supplied to the input terminals 1, 1′. The threshold voltage that has been built up will now prevent signals lying below its voltage level from reaching the corresponding output terminal. If $U_{tr}$ designates the threshold voltage, $U_{in}$ designates the highest input voltage and F designates the amplification of the amplifier reduced by the attenuation of the feedback circuit, the following holds true:

$$U_{tr}=U_{in}-U_{tr}/F$$

This equation shows that the voltage $U_{tr}$ will lie insignificantly below the input voltage $U_{in}$ if the amplification $F$ is high. The relationships between the input voltages ($U_{1\,in}$, $U_{2\,in}$) at the input terminals 1, 1′ and the output voltages ($U_{1\,ut}$, $U_{2\,ut}$) at the output terminals 2, 2′ may be taken from the following table:

| Input Voltages | Voltage at Terminal 2 | Voltage at Terminal 2′ |
|---|---|---|
| $U_{1\,in}=U_{2\,in}=0$ | 0 | 0 |
| $U_{1\,in}>U_{2\,in}$ | $U_{1\,in}$ | 0 |
| $U_{1\,in}<U_{2\,in}$ | 0 | $U_{2\,in}$ |

Figure 2:
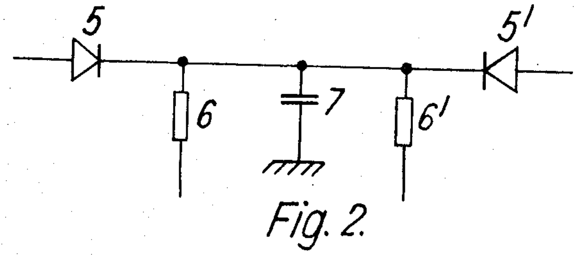
FIG. 2 shows a modification of a portion of the feedback circuit of FIG. 1.

The circuit described above has a very short reaction period, which is advantageous in certain applications. In connection with speech controlled duplex amplifiers in telephony, in which echo signals (electric or acoustic) occur, it is desirable to prevent the signals from passing through the comparison circuit. This is achieved by delaying the disappearance of the threshold voltage. In this manner it will be possible to eliminate incoming echo signals. For this purpose, as may be seen from FIG. 2, a capacitor 7 for storing the threshold voltage is connected between the interconnecting points of the two feedback circuits and ground. The delay period of the stored threshold voltage of the capacitor 7 may be selected within a wide range by appropriate design of capacitor 7. The echo signal decays exponentially, and the capacitor 7 should be designed in consideration of this. It should be pointed out that although the capacitor 7 causes a delay in the buildup of the threshold voltage, the buildup period is considerably shorter than the discharge period. The latter is determined by the values of the resistors 6, 6′.

Figure 3:
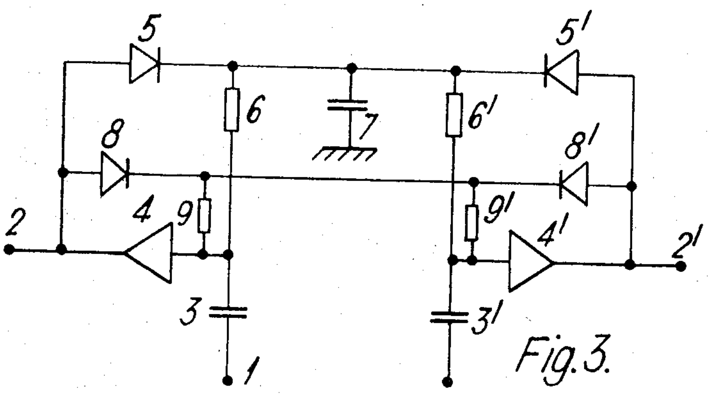
FIG. 3 shows another embodiment of the feedback circuit in accordance with the invention.

FIG. 3 illustrates a particularly advantageous embodiment of the comparison circuit in accordance with the invention. In this embodiment of the circuit an additional feedback circuit is coupled in parallel to each feedback circuit having a delayed threshold voltage, with the junction points between the diode devices 8, 8′ and the resistors 9, 9′ of the last-mentioned feedback circuits being interconnected, thereby providing the advantage of fast reaction in the circuit in combination with eliminating undesired output signals as the result of any echo signals that may be present.

The comparison circuit is not intended to be restricted to the embodiments described above, as modifications thereof may be carried out by anyone skilled in the art within the scope of the invention.

We claim:

1. A comparison circuit having two input terminals and two output terminals adapted to directly compare two alternating voltages with respect to their magnitudes comprising a plurality of capacitors, a plurality of amplifier circuits having high amplification, means connecting each capacitor in series with an amplifier between each input terminal and the corresponding output terminal, a feedback circuit including a diode device and a resistor connected in parallel with each amplifier circuit, and means interconnecting junction points of the diode devices and the resistors of the two feedback circuits thereby achieving a common threshold voltage at the inputs of the two amplifier circuits, said threshold voltage rising and falling in amplitude in accordance with fluctuations in the value of the larger input voltage, said circuit providing an output voltage only on the output terminal whose corresponding input terminal has been supplied with the higher input voltage.

2. A comparison circuit in accordance with claim 1, in which symmetry exists with respect to the components connected between the input terminals and the corresponding output terminals.

3. A comparison circuit in accordance with claim 2, in which a capacitor is connected between the junction point of the two feedback circuits and ground, thereby providing the circuit with a certain delay and avoiding an output signal as the result of any existing echo signal.

4. A comparison circuit in accordance with claim 3, in which an additional feedback circuit is connected in parallel to each of said feedback circuits, and the junction points between the diode devices and the resistors of said additional feedback circuits are interconnected, whereby the advantage of fast reaction in the circuit is combined with eliminating an undesired output signal as the result of any existing echo signal.

5. A comparison circuit in accordance with claim 1, in which the amplifier circuit comprises one or more amplifier stages.